United States Patent [19]
Takahashi et al.

[11] Patent Number: 4,853,578
[45] Date of Patent: Aug. 1, 1989

[54] DRIVING APPARATUS FOR ULTRASONIC MOTOR

[75] Inventors: Kenichiroh Takahashi, Katano; Noriyuki Harao, Ikoma; Hiromi Tanoue, Kadoma, all of Japan

[73] Assignee: Matsushita Electric Industrial Co., Ltd., Kadoma, Japan

[21] Appl. No.: 141,036

[22] Filed: Jan. 5, 1988

[30] Foreign Application Priority Data

Jan. 8, 1987 [JP] Japan ................................. 62-2365

[51] Int. Cl.$^4$ ............................................. H01L 41/08
[52] U.S. Cl. ........................................ 310/315; 310/316
[58] Field of Search ............... 310/314, 315, 316, 317; 331/94.5 ML, 94.5 C, 94.5 D, 65, 70, 158, 15, 118 R, 176, 66, 177 R, 179; 318/116, 118

[56] References Cited

U.S. PATENT DOCUMENTS

| | | | |
|---|---|---|---|
| 3,322,981 | 5/1967 | Brenig | 310/315 |
| 3,719,838 | 3/1973 | Peduto | 310/315 |
| 3,967,143 | 6/1976 | Watanabe et al. | 310/315 X |
| 4,020,426 | 4/1977 | Helle | 310/315 X |
| 4,267,478 | 5/1981 | Ljung et al. | 310/315 |
| 4,314,174 | 2/1982 | Wing et al. | 310/315 |
| 4,376,919 | 3/1983 | Konno | 310/315 X |
| 4,400,705 | 8/1983 | Horike | 310/315 X |
| 4,456,892 | 6/1984 | Vandergraaf | 310/315 X |
| 4,492,933 | 1/1985 | Grieco | 310/315 X |
| 4,562,373 | 12/1985 | Tokusina et al. | |

FOREIGN PATENT DOCUMENTS

3406408 8/1984 Fed. Rep. of Germany .

OTHER PUBLICATIONS

"Ultrasonic Motor"; published 1986; Matsushita Electric Industrial Co., Ltd.
Data Book of Industrial Use of the Linear IC: published 1986; pp. 442–447 & 482–487; NEC Corporation.
The Linear Circuits Data Book; published 1985; pp. 9-37-9-45; Texas Instruments Japan Limited.

Primary Examiner—Mark O. Budd
Attorney, Agent, or Firm—Cushman, Darby & Cushman

[57] ABSTRACT

In a driving circuit for a piezoelectric ultrasonic motor (23) supplying driving signal from an astable oscillator (51), which comprises an oscillation IC (49), a capacitor (48) and charge-discharge resistors (45, 46, 47), is controlled by controlling leakage current through a leakage resistor (47) to a point E, through controlling of the voltage of the point E by a temperature-dependent voltage producing circuit 52.

3 Claims, 6 Drawing Sheets

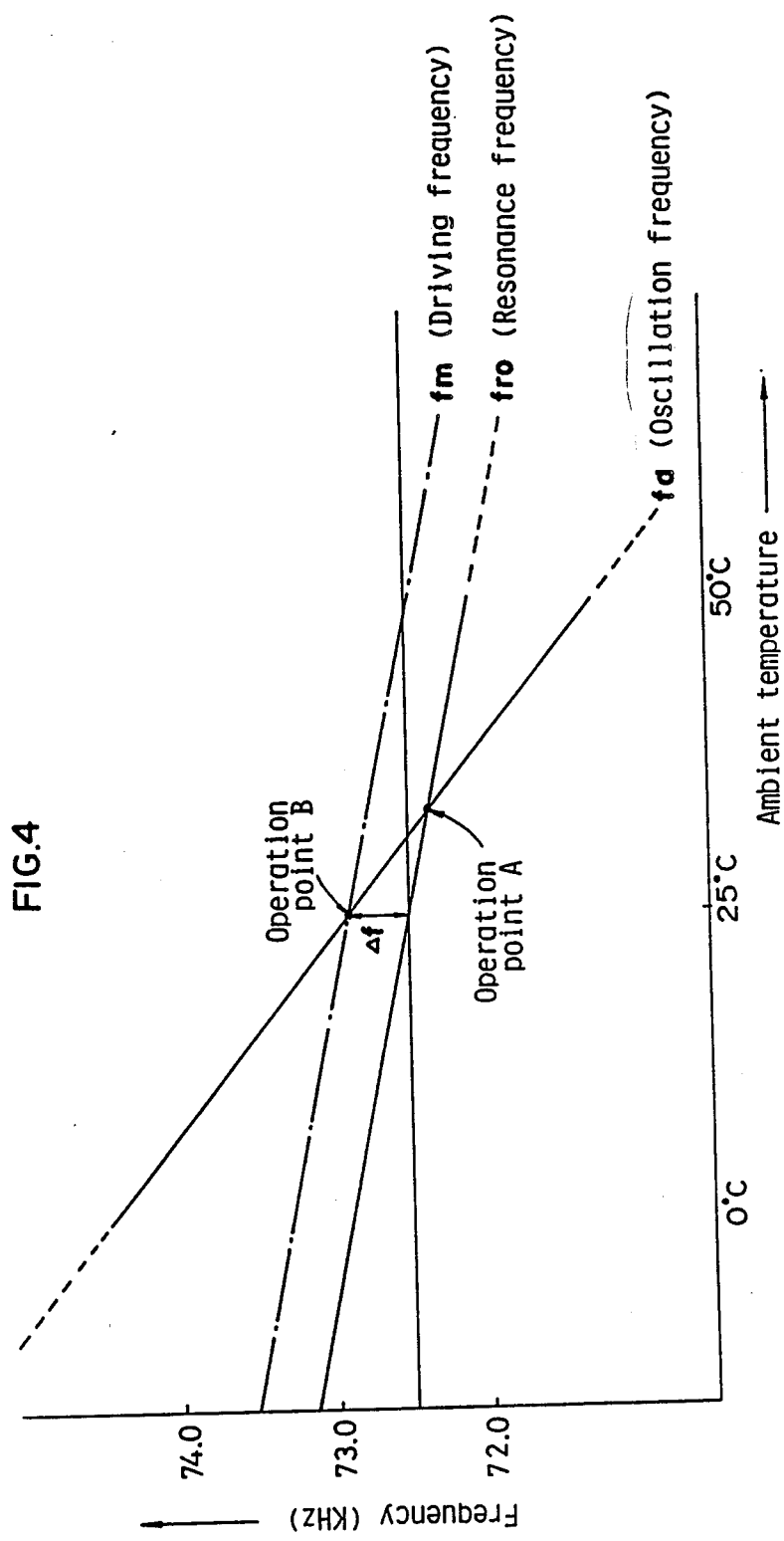

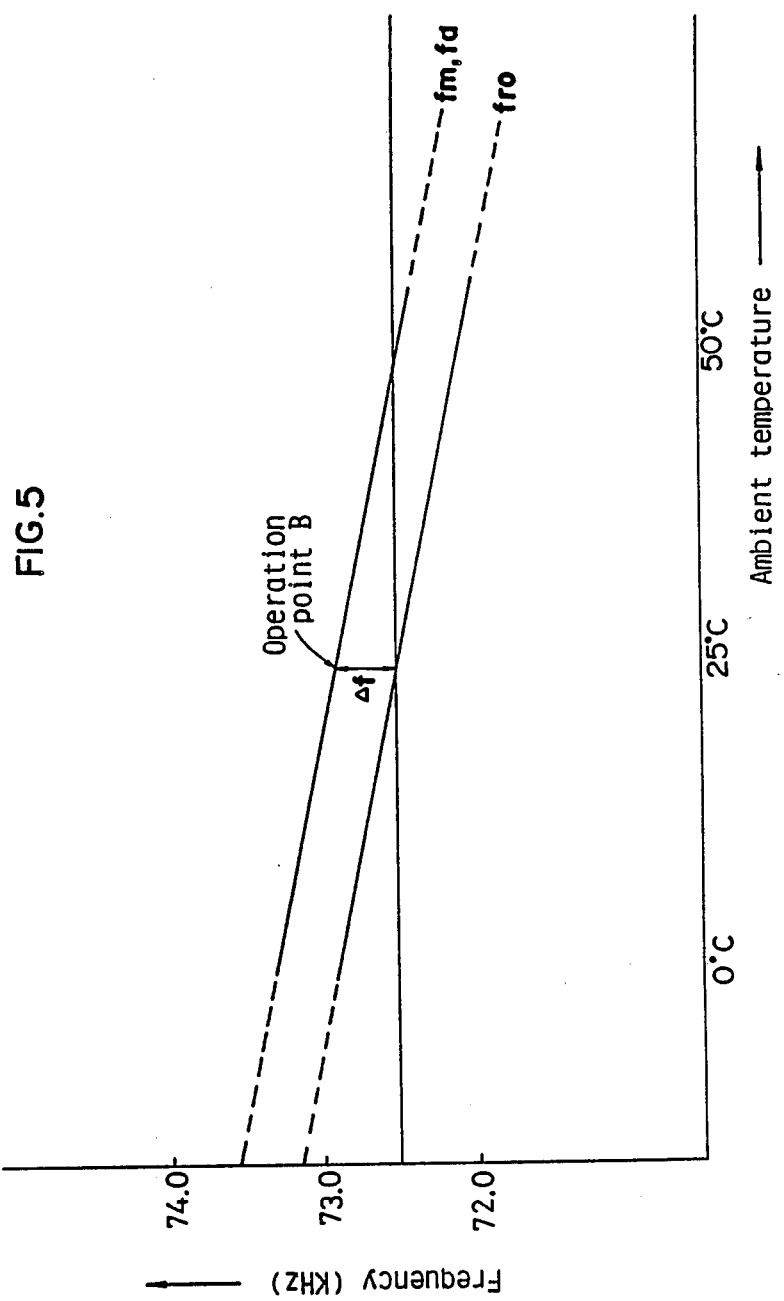

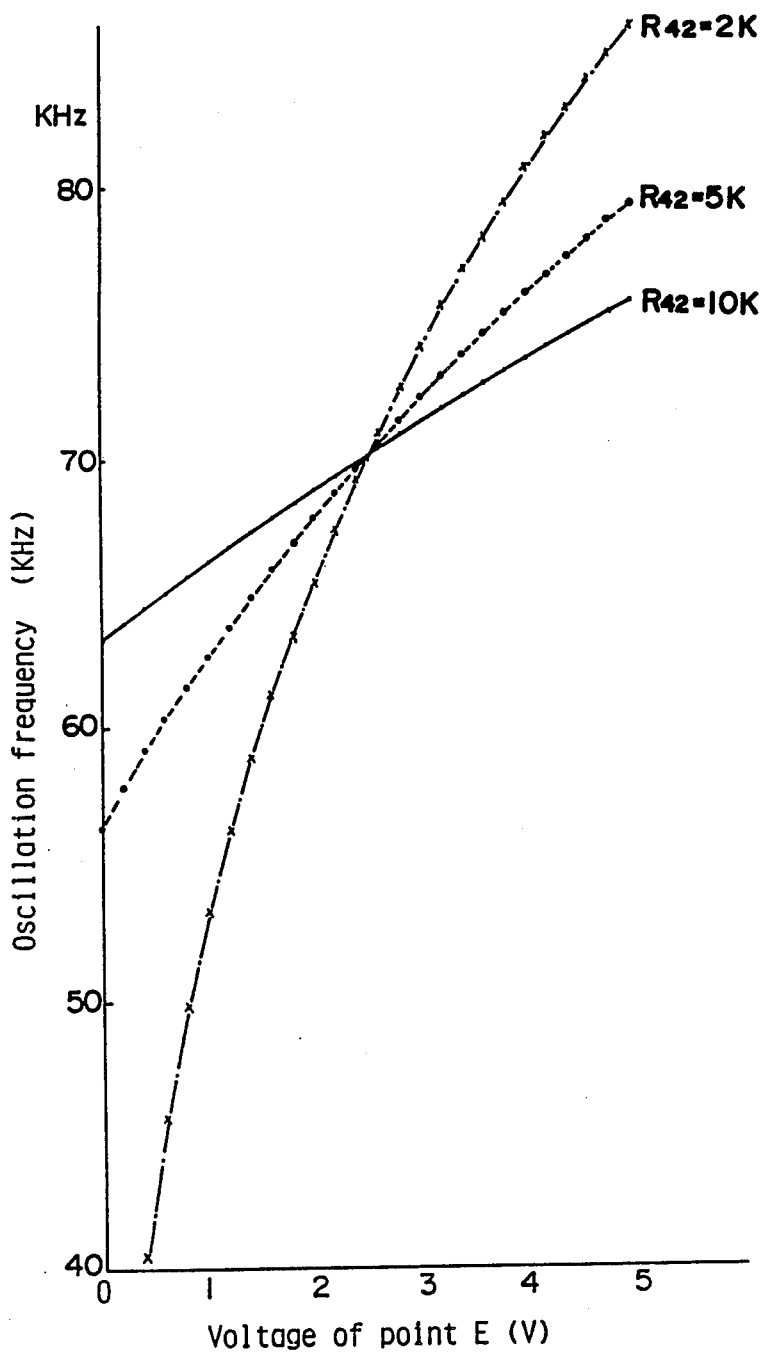

DRIVING APPARATUS FOR ULTRASONIC MOTOR

FIELD OF THE INVENTION

The present invention relates to a driving apparatus for an ultrasonic motor, and particularly concerns a driving circuit capable of stably driving the ultrasonic motor for a wide range of temperature variation.

DESCRIPTION OF THE RELATED ART

Recently, ultrasonic motors wherein driving motion or rotation is obtained by producing various ultrasonic vibrations by utilizing electro-mechanical devices, such as piezoelectric ceramics or the like, are paid attention to due to their high energy density characteristics.

For instance, the prior art ultrasonic motor having the general configuration as shown in FIG. 2 has been proposed and known. That is, the ultrasonic motor shown in FIG. 2 comprises a stator 4 and a rotor 14 held rotatably on the stator 4. The stator 4 has a pair of disk shaped piezoelectric members 1, 2 and a disk shaped elastic member 3, and these members are stacked in thicknesswise direction thereof to constitute the stator 4. The rotor 14 has a disk shaped substrate 5 having an output shaft 8, a journal shaft 7 on its axis and a ring shaped lining 6 fixed on the lower face of the substrate. The rotor 14 is mounted on the stator 4 so the lining 6 of the rotor 14 is disposed on ring shaped protrusion 3a which is provided on the elastic disk 3, so the connection shaft 7 is received by a bearing 9 and is connected to a fixing nut 11 with a washer spring 10 inbetween for providing an appropriate connection force, i.e., a friction torque between the stator 4 and the rotor 14. The piezoelectric members 1 and 2 have several segments divided in the rotational direction with alternating piezoelectric polarities as shown by marks + and − in FIG. 2. The segments on respective piezoelectric members 1 and 2 are disposed with a preset phase difference in the rotational direction. The piezoelectric members 1 and 2 are driven by electric signals having different phases to produce a mechanical travelling wave which travels in the rotational direction to rotate the rotor 4.

Like the driving apparatus for the above-mentioned general and known ultrasonic motor, the driving circuit as shown in FIG. 3 has been proposed and known. The driving apparatus of FIG. 3 is elucidated below.

First, a predetermined frequency $f_m$, which is determined to have a particular relation to resonance frequency of the stator 4 for efficient driving of the stator 4, is oscillated by an oscillator 15, and is given to a first amplifier 16, and further to a phase-shifter 17, whose output signal is further given to a second amplifier 18. The phase-shifter 17 shifts the phase of the input signal from ±10° to ±170°, to enable positive direction rotation and negative direction rotation, and issues a waveform-shaped and phase-shifted signal therefrom. The output signal of the first amplifier 16 is applied to the first piezoelectric member 1 through first lead wires 19 and 20; and the output of the second amplifier 18 is applied to the second piezoelectric member 2 through second lead wires 21 and 20. The first piezoelectric member 1 has four pairs of 45°-fan-shaped piezoelectric members wherein positive polarized members and negative polarized one, respectively shown by + and − marks on FIG. 2, are alternately disposed. The 8 pieces of 45°-fan-shaped members are partially circular elements and together encircle the center of the disk shaped member 1. Thus the first piezoelectric member 1 has four waves of mechanical vibration waves in a circular direction around the center. Similarly, the second piezoelectric member 2 has four waves of mechanical vibration waves in a circular direction around the center. The first piezoelectric member 1 and the second piezoelectric member 2 are stacked in a manner that the radial dividing gaps between the neighboring two fan-shaped piezoelectric elements 13 of the first piezoelectric member 1 is are disposed on the center part of the fan-shaped piezoelectric elements 13' of the second piezoelectric member 2; namely with each member differing by 22.5° C. therebetween. Thus, the first amplifier, the phase-shifter and the second amplifier together constitute the driving circuit 22 for the ultrasonic motor. By configurating the stator 4 in the above-mentioned manner and by driving the stator by the above-mentioned driving circuit 22, maximum amplitude points of vibration of the stator 4, which touches the lower face of the rotor 14, move circularly around the axis. Thereby the rotor 14 is given a rotation driving force around its axis. Thus the rotor 14 is rotated around the journal shaft 7. The rotation of the rotor 14 is made by the travelling wave in a rotational direction having the driving frequency $f_m$ which is selected to have a particular relation to the mechanical characteristic of the stator 4. The driving frequency $f_m$ must be selected to corresponds to the mechanical characteristics of the stator 4.

In the above-mentioned conventional configuration, the oscillation frequency $f_d$ of the oscillator 15 is selected to agree to the theoretical driving frequency $f_m$ which is determined to have a certain relation with the resonance frequency $f_{r0}$ of the piezoelectric elements of the stator 4. But, even though the oscillation frequency $f_d$ is selected in the above-mentioned way, if temperature dependency of the resonance frequency $f_{r0}$ of the piezoelectric elements and oscillation frequency $f_d$ of the oscillator 15 have difference therebetween, such discrepancies induced by the above-mentioned disagreement of temperature dependency, as shown in FIG. 4, is produced by variation of ambient temperature Tc. That is, even when under an ambient of 25° C. the oscillation frequency $f_d$ is selected to agree with the driving frequency $f_m$, which is determined to respond to the resonance frequency $f_{r0}$ of the piezoelectric elements as shown by the point B, as the ambient temperature Tc rises, thereby shifting the operation point to A point, the oscillation frequency $f_d$ becomes to agree with the resonance frequency $f_{r0}$. Therefore, an overcurrent flows in the ultrasonic motor, thereby damaging to stable rotation of the ultrasonic motor. On the other hand, when the ambient temperature Tc lowers from the operation point B, the oscillation frequency $f_d$ differs greatly from the driving frequency $f_m$, and hence considerbly lowers the efficiency of the motor driving by the shifting of the operation point far from anti-resonance point. In an extreme case, the motor will stop, and further it becomes impossible to start the ultrasonic motor.

OBJECT AND SUMMARY OF THE INVENTION

The present invention resolves the above-mentioned shortcoming of the conventional driving apparatus for ultrasonic motor, and provides an improved driving apparatus for an ultrasonic motor, capable of stable operation by preventing lowering of the motor driving efficiency. In order to achieve the above-mentioned purpose, the driving apparatus for an ultrasonic motor in accordance with the present invention comprises an oscillator, a temperature characteristic correction circuit for correcting the temperature characteristic of oscillation frequency of the oscillator to be equal to the temperature characteristic of resonance frequency of piezoelectric elements constituting the ultrasonic motor, and a driving circuit for issuing output power to drive the piezoelectric elements of the ultrasonic motor.

As a result of the above-mentioned configuration, the driving apparatus for the ultrasonic motor in accordance with the present invention can make the temperature variation characteristic of the oscillation frequency $f_d$ agree with the temperature variation characteristic of the resonance frequency $f_{r0}$ of the piezoelectric elements as shown in FIG. 5. Thereby the temperature variation of the resonance frequency $f_d$ can agree with the temperature variation of the driving frequency $f_m$.

Accordingly, even though the ambient temperature changes, a constantly stabilized driving state is obtainable, thereby preventing a decrease in the motor driving efficiency and retaining stable revolution of the ultrasonic motor.

Besides, as a result of the above-mentioned configuration, undesirable overcurrent in the ultrasonic motor at undesirable agreement of the oscillation frequency $f_d$ with the resonance frequency $f_{r0}$ of the piezoelectric elements can be eliminated. Thereby, undesirable operation of the motor or damaging of the motor or the driving circuit by such overcurrent or undesirable stoppage of the motor is avoidable.

While the novel feature of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 4 is the temperature characteristic graph of the conventional ultrasonic motor.

FIG. 5 is the temperature characteristic graph of an ultrasonic motor embodying the present invention.

FIG. 6 is a graph showing the relation between the voltage at point E of the circuit of FIG. 1 and the dependent variation of the oscillation frequency of the preferred embodiment.

DESCRIPTION OF THE PREFERRED EMBODIMENTS

Figure 1:
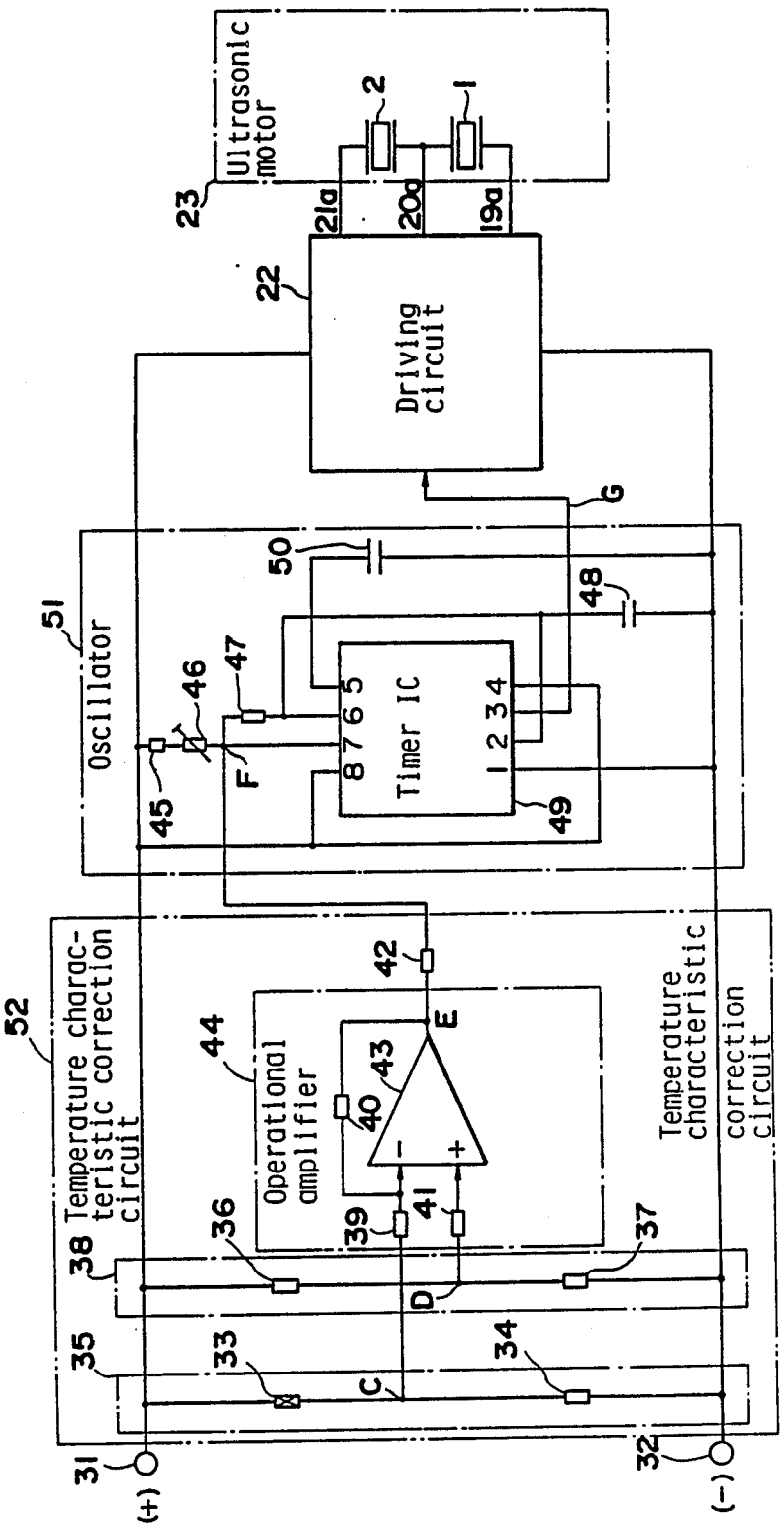
FIG. 1 is a circuit block diagram of the driving apparatus for an ultrasonic motor embodying the present invention.
Figure 2:
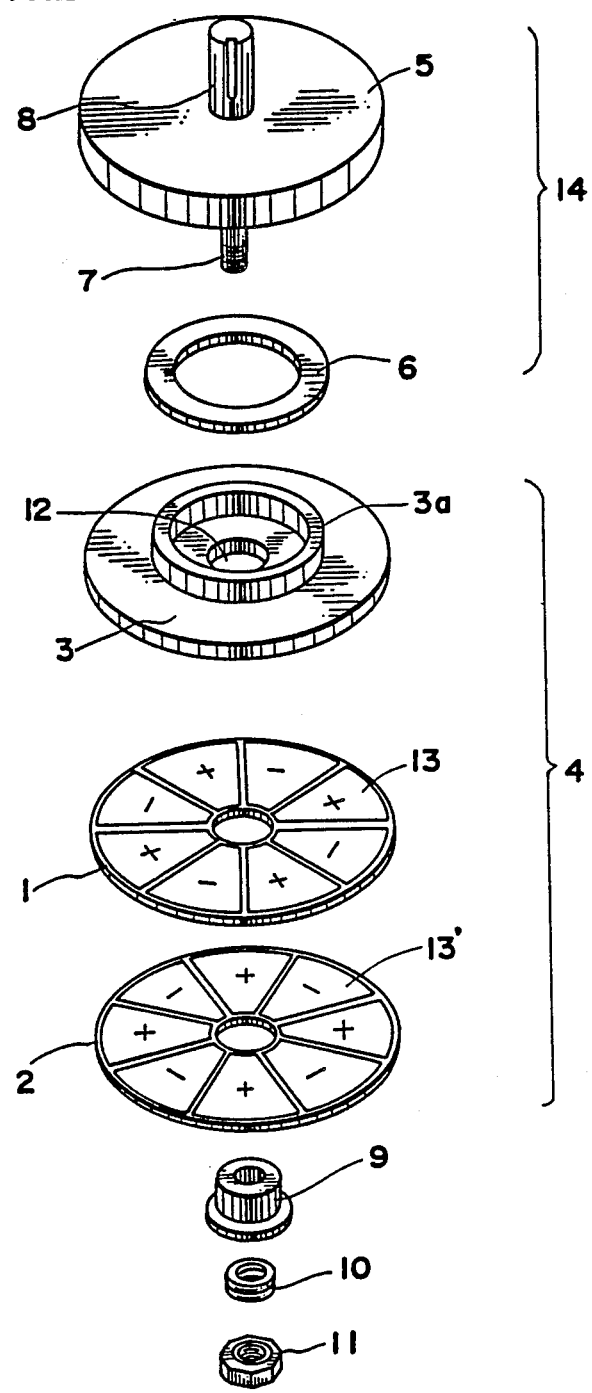
FIG. 2 is an exploded perspective view of the general and known ultrasonic motor.
Figure 3:
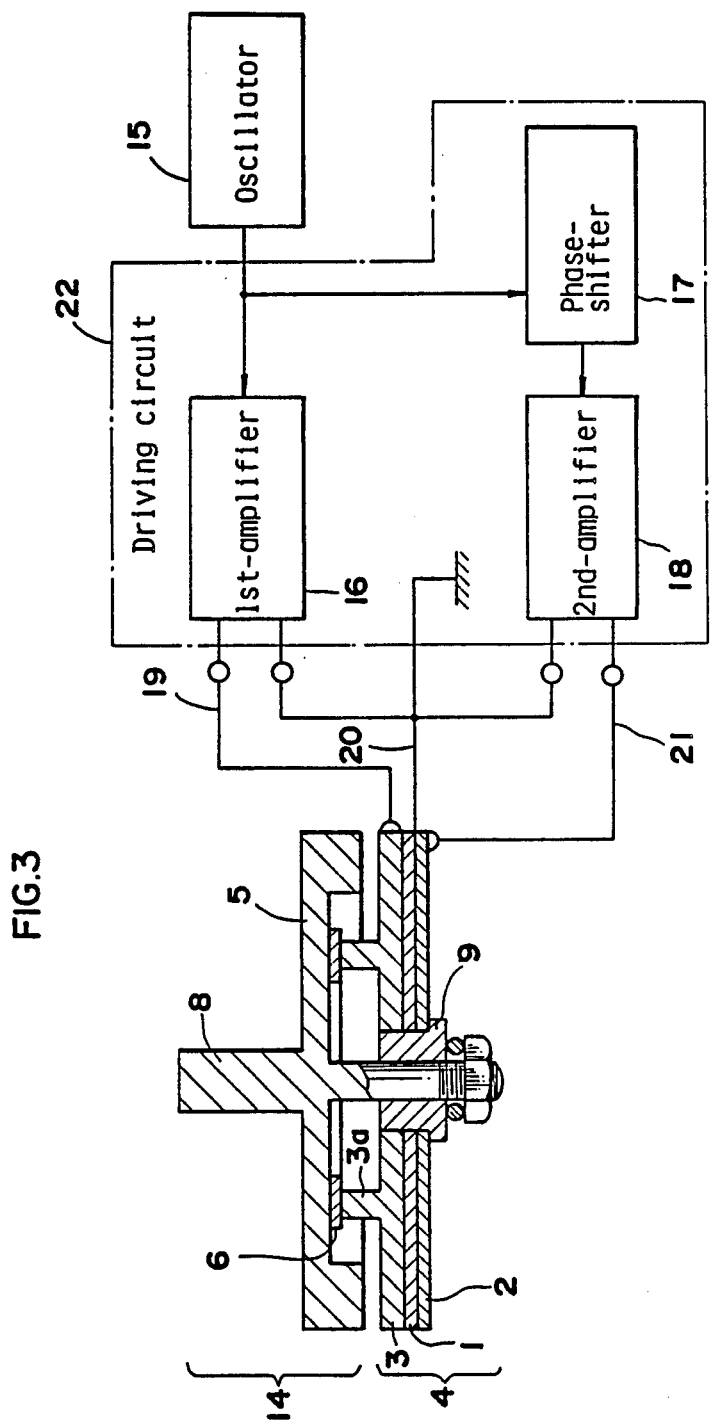
FIG. 3 is the circuit block diagram showing the configuration of the conventional driving apparatus for the conventional ultrasonic motor.

A preferred embodiment of the driving apparatus for an ultrasonic motor in accordance with the present invention is described with reference to the accompanying drawing, wherein FIG. 1 is a circuit diagram of the embodiment and corresponding parts and components to the above-mentioned conventional example of FIG. 2 and FIG. 3 are shown by designating with the same or corresponding numerals and marks. An ultrasonic motor 23, comprising a first piezoelectric member 1 and a second piezoelectric 2 having the same configuration as shown in FIG. 2, is connectted to a driving circuit 22 by lead wires 19a, 20a and 21a to be electrified by the driving circuit 22. The drivin circuit 22 is connected to an oscillator 51 which comprises a timer IC 49 available in the market (for instance μPC617/1555 or μPD5555C/5555G manufactured by NEC Corporation of Japan, or TL1555 manufactured by Japan Texas Instruments Corporation) and resistors 45 and 47, semi-fixed resistors 46 and capacitors 48 and 50. The driving circuit 22 is further connected to a temperature characteristic correction circuit 52 for correcting temperature characteristic of the oscillator 51 in such a manner that oscillation frequency $f_d$ of the oscillator 51 becomes equal to the temperature characteristic of resonance frequency $f_{r0}$ of the piezoelectric members 1 and 2 of the ultrasonic motor 23. The temperature characteristic correction circuit 35 comprises a temperature detection circuit, which is a series connection of a resistor 33 and a resistor 34 having different temperature characteristics, connected across a positive power terminal 31 and a negative power terminal 32. The detection circuit then issues on output from its intermediate junction point C to a first input terminal of an operational amplifier 43 through a resistor 39. A constant voltage circuit 38 consists of a first resistor 36 and a second resistor 37, connected in series across the positive power source terminal 31 and the negative power source terminal 32 of the same temperature characteristics the constant voltage circuit 38 issues from its intermediate junction point D a constant voltage to the other input terminal of the operational amplifier 43 through a resistor 41. Across the first input terminal of the operational amplifier 43 and the output terminal E thereof, a feedback resistor 40 is connected. The output signal of the operational amplifier circuit 44, consisting of the operational amplifier 43 and the resistors 39, 40 and 41, is given through the output resistor 42 to an input terminal number 7 of the timer IC 49 in the oscillator 51. By such configuration, the temperature characteristic of the oscillation frequency $f_d$ of the oscillator 51 is corrected to become equal to that of the temperature characteristic of the resonance frequency of the piezoelectric members 1 and 2 in the ultrasonic motor 23.

The operation of the above-mentioned driving apparatus of the ultrasonic motor is elucidated.

First, operation of the oscillator 51 is elucidated. The timer IC 49, together with resistors 45 and 47, semi-fixed resistor 46 and the capacitor 40 constitute an astable oscillator 51. In the astable oscillator 51, the capacitor 48 is charged by a current given through the resistor 45, semi-fixed resistor 46 and the resistor 47, and the charge stored in the capacitor 48 is discharged through the capacitor 47. The voltage of the capacitor 48 moves between a trigger voltage (hereafter is referred as $V_{TR}$) and a threshold voltage (hereafter is referred as $V_{TH}$). The trigger voltage $V_{TR}$ and the threshold voltage $V_{TH}$ are selected to be as follows with respect to the source voltage $V_{CC}$ impressed across the power source terminals 31 and 32:

$$V_{TR} = \tfrac{1}{3} V_{CC} \qquad (1),$$

$$V_{TH} = \tfrac{2}{3} V_{CC} \qquad (2).$$

Now provided that the series resistance consisting of the resistors 45 and 46 is $R_1$ and the resistance of the resistor 47 is $R_2$ and capacitance of the capacitor 48 is $C_1$, charging time $t_1$, when the output voltage at output point G of the oscillator is in the H state, is given by:

$$t_1 = 0.693(R_1 + R_2)C_1 \quad (3),$$

and the charging time $T_2$, when the output voltage at G point is in the L state, is given by:

$$t_2 = 0.693 R_2 C_1 \quad (4).$$

Therefore, the period T of the oscillation is given as follows:

$$\begin{aligned} T &= t_1 + t_2 \\ &= 0.693(R_1 + 2R_2)C_1 \end{aligned} \quad (5)$$

Hence, the oscillation frequency f is given as follows:

$$f = 1/T = 1.44/(R_1 + 2R_2)C_1 \quad (6).$$

The oscillation frequency f can be determined by selection of the values of the resistances R1 and R2 and capacitance C1, and the selection of the oscillation frequency f can be determined independent from the supplied power source voltage. (The above-mentioned art is disclosed in a book entitled Linear Circuit Data Book 1985, published by Texas Instruments Japan Limited, or a book entitled Sangyouyou Linear IC 1986 (Linear IC for Industrial Use 1986) published by NEC Corporation of Japan).

As is obvious from the above-mentioned, the temperature variation rate of the oscillation frequency f is determined by temperature variation rates of the resistors 45, 46 and 47 and the capacitance 48. Therefore, the selection of these electric components should be very careful. Retaining the temperature variation characteristic of the oscillation frequency f within a predetermined value by means of selections of the electric components and combination thereof has a technical limit, and such selection induces great increase of manufacturing cost. Accordingly it becomes necessary to provide a measure to limit the temperature variation rate of the oscillation frequency within a predetermined small value with a simple circuit configuration.

The feature of the present invention is that the charging current to the capacitor 48 and discharging current therefrom is controlled to respond to the temperature variation. So, the temperature variation rate of the oscillation frequency f is controlled within a predetermined value. That is, in the embodiment, by a resistor 42 which is connected to the junction point f between the two resistors 46 and 47, a part of the charging and discharging current is bypassed to the output terminal E of the operational amplifier 43. Accordingly, by controlling the voltage of the output terminal E of the operational amplifier 43 to respond to temperature variation, the oscillation frequency f can be controlled so that the temperature variation rate of the oscillation frequency is limited to within a predetermined value.

FIG. 6 shows experimental results of the temperature variation of the oscillation frequency f corresponding to the variation of the voltage of the point E, with regard to three resistances of the resistor 42 as a parameter.

The control of voltage of the point E in the temperature characteristic correction circuit 52 is made as follows: provided that the resistance $R_{33}$, $R_{34}$, $R_{36}$ and $R_{37}$, respectively of the resistors 33, 34, 36 and 37 at 25° C. are as follows:

$R_{33}$ = 10 KΩ
  (temperature variation rate ... + 2000 ppm/°C.),
$R_{34}$ = 20 KΩ
  (" ... + 100 ppm/°C.),
$R_{36}$ = 10 KΩ
  (" ... + 100 ppm/°C.) and
$R_{37}$ = 20 KΩ
  (" ... + 100 ppm/°C).

When the ambient temperature varies from 0° C. to 50° C., the output voltage of the temperature change detection circuit 35, that is, the voltage $V_c$ of the junction point C, and output voltage $V_D$ of the constant voltage circuit 38, that is, the voltage of the junction point D, become as shown in table 1.

Circuit $G_A$ of the operational amplifier circuit 44 is given by:

$$G_A = R_{40}/R_{39} \quad (7),$$

where $R_{39}$ and $R_{40}$ are resistances of the resistors 39 and 40, respectively. therefore the voltage $V_E$ at the output terminal E of the operational amplifier 44, constituted by the operational amplifier 43 and resistors 39, 40 and 41, is given as follows:

$$\begin{aligned} V_E &= V_D + (V_C - V_D) \times G_A \\ &= V_D + (V_C - V_D) \times \frac{R_{40}}{R_{39}}. \end{aligned} \quad (8)$$

Now provided that $R_{39}$ = 10 KΩ
  (temperature variation rate ... + 100 ppm/°C.) and
$R_{40}$ = 100 KΩ
  (temperature variation rate ... + 100 ppm/°C.), $G_A = 10$ is obtainable. Accordingly, the output voltage $V_E$ becomes:

$$V_E = V_D + (V_C - V_D) \times 10. \quad (9)$$

The values of table 1 are obtained from the above-mentioned equation (9).

TABLE 1

| | Resistance of $R_{33}$ (KΩ) | Resistance of $R_{34}$ (KΩ) | Voltage of point C (V) | Voltage of point D (V) | Voltage of point E (V) |
|---|---|---|---|---|---|
| 0° C. | 9.5 | 19.98 | 3.389 | 3.333 | 2.773 |
| 25° C. | 10 | 20.00 | 3.333 | 3.333 | 3.333 |
| 50° C. | 10.5 | 20.02 | 3.280 | 3.333 | 3.863 |

($V_{CC} = 5$ V)

As is shown in the table, the output voltage $V_E$ at the point E in the embodiment, becomes low in the low temperature side, and becomes high in the high temperature side. Therefore, when the measured results are applied to the characteristic of FIG. 6, the oscillation frequency of the oscillator becomes lower in the lower temperature side and becomes high in the high temperature side. When the above-mentioned characteristics are applied to the characteristic of FIG. 6, the oscillation frequency of the oscillator 51 is lowered at the low temperature side. As a result of the temperature characteristic correction made by the circuit 52, the temperature correction of the oscillation frequency $f_d$, as shown in FIG. 4, is obtainable. Therefore, by appropriately selecting the temperature variation rate of the resistors 33 and 34 and the circuit gain $G_A$, the temperature variation rate of the oscillation frequency of the oscillator 51 can be made equal to that of the resonance frequency of the piezoelectric members 1 and 2 of the ultrasonic motor 23, thereby to obtain the temperature characteristic as shown in FIG. 5.

The driving circuit 22 applies output driving powers to the piezoelectric members 1 and 2 responding to output signal at the output terminal G of the oscillator 51.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

What is claimed:

1. A driving apparatus for an ultrasonic motor having piezoelectric elements, comprising:
    an oscillator having an oscillation frequency, the oscillation frequency having a temperature characteristic;
    a temperature characteristic correction circuit means, including a temperature sensing resistor, for (1) converting a change in resistance of the temperature sensing resistor to a change of voltage and (2) changing the oscillation frequency of the oscillator to correct the temperature characteristic of the oscillation frequency of said oscillator to be equal to the temperature characteristic of the resonance frequency of the piezoelectric elements; and
    a driving circuit for issuing output power to drive said piezoelectric elements of said ultrasonic motor.

2. A driving apparatus for an ultrasonic motor in accordance with claim 1 wherein
    said oscillator is a stable oscillator where the oscillation frequency is determined by charge and discharge of a capacitor; and
    said temperature characteristic correction circuit comprises:
    a temperature variation detecting circuit and a constant voltage circuit both connected across positive and negative power source terminals, and
    an operational amplifier wherein one input terminal receives an output of said temperature variation detecting circuit and the other input terminal receives an output of said constant voltage circuit.

3. A driving apparatus for an ultrasonic motor in accordance with claim 2 wherein
    said temperature variation detecting circuit comprises a first resistor and a second resistor having different temperature characteristics and being connected in series across said positive and negative power source terminals, creating a junction point between the first and second resistors, the junction point issuing an output.

* * * * *